(12) United States Patent
Jou et al.

(10) Patent No.: US 9,236,459 B2
(45) Date of Patent: Jan. 12, 2016

(54) INSULATED GATE BIPOLAR TRANSISTOR (IGBT) ELECTROSTATIC DISCHARGE (ESD) PROTECTION DEVICES

(75) Inventors: Yeh-Ning Jou, Taipei County (TW); Shang-Hui Tu, Tainan (TW); Jui-Chun Chang, Hsinchu (TW); Chen-Wei Wu, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 244 days.

(21) Appl. No.: 13/232,975

(22) Filed: Sep. 14, 2011

(65) Prior Publication Data

US 2012/0001225 A1    Jan. 5, 2012

Related U.S. Application Data (62) Division of application No. 12/358,943, filed on Jan. 23, 2009, now Pat. No. 8,049,307.

(51) Int. Cl.
 *H01L 29/66* (2006.01)
 *H01L 29/739* (2006.01)
 *H01L 27/02* (2006.01)

(52) U.S. Cl.
 CPC ........ *H01L 29/7393* (2013.01); *H01L 27/0259* (2013.01)

(58) Field of Classification Search
 CPC .................... H01L 29/7393; H01L 27/0259
 USPC ................................................... 257/139
 See application file for complete search history.

(56) References Cited

U.S. PATENT DOCUMENTS

| 4,890,146 | A | * | 12/1989 | Williams et al. | 257/336 |
|---|---|---|---|---|---|
| 5,202,573 | A | * | 4/1993 | Shirai | 257/140 |
| 5,362,979 | A | | 11/1994 | Merchant | |
| 5,517,046 | A | * | 5/1996 | Hsing et al. | 257/336 |
| 5,559,348 | A | * | 9/1996 | Watabe et al. | 257/141 |
| 5,585,657 | A | * | 12/1996 | Efland et al. | 257/335 |
| 6,313,508 | B1 | * | 11/2001 | Kobayashi | 257/351 |
| 6,365,932 | B1 | * | 4/2002 | Kouno et al. | 257/341 |
| 6,614,077 | B2 | * | 9/2003 | Nakamura et al. | 257/355 |
| 6,900,097 | B2 | | 5/2005 | Chen et al. | |
| 2005/0073007 | A1 | * | 4/2005 | Chen et al. | 257/355 |
| 2005/0106825 | A1 | * | 5/2005 | You et al. | 438/301 |

(Continued)

FOREIGN PATENT DOCUMENTS

| CN | 2914330 | Y | * | 6/2007 | H01L 27/12 |
|---|---|---|---|---|---|
| JP | 2005-5596 | | | 1/2005 | |

*Primary Examiner* — Jarrett Stark (57) ABSTRACT

Insulated gate bipolar transistor (IGBT) electrostatic discharge (ESD) protection devices are presented. An IGBT-ESD device includes a semiconductor substrate and patterned insulation regions disposed on the semiconductor substrate defining a first active region and a second active region. A high-V N-well is formed in the first active region of the semiconductor substrate. A P-body doped region is formed in the second active region of the semiconductor substrate, wherein the high-V N-well and the P-body doped region are separated with a predetermined distance exposing the semiconductor substrate. A $P^+$ doped drain region is disposed in the high-V N-well. A $P^+$ diffused region and an $N^+$ doped source region are disposed in the P-body doped region. A gate structure is disposed on the semiconductor substrate with one end adjacent to the $N^+$ doped source region and the other end extending over the insulation region.

9 Claims, 10 Drawing Sheets

(56) References Cited

U.S. PATENT DOCUMENTS

| | | | |
|---|---|---|---|
| 2006/0057784 A1* | 3/2006 | Cai et al. ........................ 438/149 | |
| 2008/0135972 A1 | 6/2008 | Ikuta et al. | |
| 2008/0166845 A1 | 7/2008 | Darwish | |
| 2008/0191316 A1 | 8/2008 | Lee | |
| 2009/0167662 A1* | 7/2009 | Kao et al. ........................ 345/90 |

* cited by examiner

INSULATED GATE BIPOLAR TRANSISTOR (IGBT) ELECTROSTATIC DISCHARGE (ESD) PROTECTION DEVICES

This application is a divisional of U.S. application Ser. No. 12/358,943, filed Jan. 23, 2009, the entire disclosure of which is hereby incorporated by reference.

BACKGROUND OF THE INVENTION

1. Field of the Invention

The invention relates to electrostatic discharge (ESD) protection devices, and in particular, to insulated gate bipolar transistor electrostatic discharge (IGBT-ESD) protection devices.

2. Description of the Related Art

Conventional high voltage electrostatic discharge (ESD) protection devices include lateral diffused metal oxide semiconductor (LDMOS) power transistors, metal oxide semiconductor field effect transistors (MOSFET), silicon control rectifiers (SCR), bipolar junction transistors (BJT), diodes and field oxide devices (FOD). For a device experiencing high voltage electrostatic discharge (ESD), an inner circuit may either be damaged or result in a latch-up effect due to an overly high trigger voltage and an overly low holding voltage. Therefore, by adding an additional driving circuit to the device, or by regulating layout parameters, trigger voltage can be reduced such that a holding voltage of the device can be higher than an operation voltage. Thus, resulting in high voltage electrostatic discharge (ESD) protection.

For conventional ultra-HV devices, a silicon-on-insulator (SOI) substrate and fabrication processes thereof are adopted to isolate individual devices, thereby eliminating parasitic effects between devices during high voltage operation. However, by using the silicon-on-insulator (SOI) substrate and fabrication processes thereof, heat dissipation ability of the ultra-HV devices may be diminished. Thus, an effective solution for dissipating heat generated by ESD protection devices has long been pursued. Meanwhile, during fabrication of high-voltage devices, the diffused concentration of well doped regions is quite low, such that relative impedance increases, therefore, diminishing the ability for the ESD protection devices to be uniformly turned on.

BRIEF SUMMARY OF THE INVENTION

Accordingly, in order to overcome the problems mentioned previously and to achieve using an insulated gate bipolar transistor (IGBT) device as an electrostatic discharge (ESD) protection device, the drain region layout of IGBT devices has been improved, such that ESD protection devices can be turned on more uniformly to improve ESD protection capability.

An embodiment of the invention provides an insulated gate bipolar transistor electrostatic discharge (IGBT-ESD) protection device, comprising: a semiconductor substrate; a patterned insulation region disposed on the semiconductor substrate defining a first active region and a second active region; a high-voltage N-well formed in the first active region of the semiconductor substrate; a P-body doped region formed in the second active region of the semiconductor substrate, wherein the high-voltage N-well and the P-body doped region are separated with a predetermined distance exposing the semiconductor substrate; a $P^+$ doped drain region disposed in the high-voltage N-well; a $P^+$ diffused region and an $N^+$ doped source region disposed in the P-body doped region; and a gate structure disposed on the semiconductor substrate with one end adjacent to the $N^+$ doped source region and with the other end extending over the patterned insulation region.

Another embodiment of the invention provides an insulated gate bipolar transistor electrostatic discharge (IGBT-ESD) protection device, comprising: a semiconductor substrate; a high-voltage N-well formed in the semiconductor substrate; a patterned insulation region disposed on the high-voltage N-well defining a first active region and a second active region; an N-type double diffused region disposed in the first active region of the high-voltage N-well; a $P^+$ doped drain region disposed in the N-type double diffused region; a P-body doped region formed in the second active region of the high-voltage N-well, wherein the N-type double diffused region and the P-body doped region are separated with a predetermined distance exposing the high-voltage N-well; a pair of $N^+$ and $P^+$ doped source regions disposed in the P-body doped region; and a gate structure disposed on the high-voltage N-well with one end adjacent to the $N^+$ doped source region and with the other end extending over the patterned insulation region.

Another embodiment of the invention provides an insulated gate bipolar transistor electrostatic discharge (IGBT-ESD) protection device, comprising: a semiconductor substrate; a high-voltage N-well formed in the semiconductor substrate; a patterned insulation region disposed on the high-voltage N-well defining a first active region and a second active region; a P-type double diffused region disposed in the first active region of the high-voltage N-well; a $P^+$ doped drain region disposed in the P-type double diffused region; a P-body doped region formed in the second active region of the high-voltage N-well, wherein the P-type double diffused region and the P-body doped region are separated with a predetermined distance exposing the high-voltage N-well; a pair of $N^+$ and $P^+$ doped source regions disposed in the P-body doped region; and a gate structure disposed on the high-voltage N-well with one end adjacent to the $N^+$ doped source region and with the other end extending over the patterned insulation region.

Another embodiment of the invention provides an insulated gate bipolar transistor electrostatic discharge (IGBT-ESD) protection device, comprising: a semiconductor substrate; a high-voltage P-well formed in the semiconductor substrate; a high-voltage N-well formed in the semiconductor substrate; patterned insulation regions disposed on the semiconductor substrate defining a first active region in the high-voltage N-well and a second and a third region in the high-voltage P-well; a $P^+$ doped drain region disposed in first active region; an $N^+$ doped source region disposed in the second active region and a P-body doped region disposed in the third active region; and a gate structure disposed on the high-voltage P-well with one end adjacent to the $N^+$ doped source region and with the other end extending over the patterned insulation region.

Another embodiment of the invention provides an insulated gate bipolar transistor electrostatic discharge (IGBT-ESD) protection device, comprising: a semiconductor substrate; a patterned insulation region disposed on the semiconductor substrate defining a first active region and a second active region; a gate structure disposed on the first active region of the semiconductor substrate; an N-type double diffused region disposed on one side of the gate structure and formed in the first active region of the semiconductor substrate; an N-well formed in the N-type double diffused region extending towards the semiconductor substrate; a $P^+$ doped drain region disposed in the N-well; an $N^+$ doped source region disposed on the other side of the gate structure in the semiconductor substrate; and a P+ diffused region disposed in the second active region of the semiconductor substrate.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

Figure 1A:
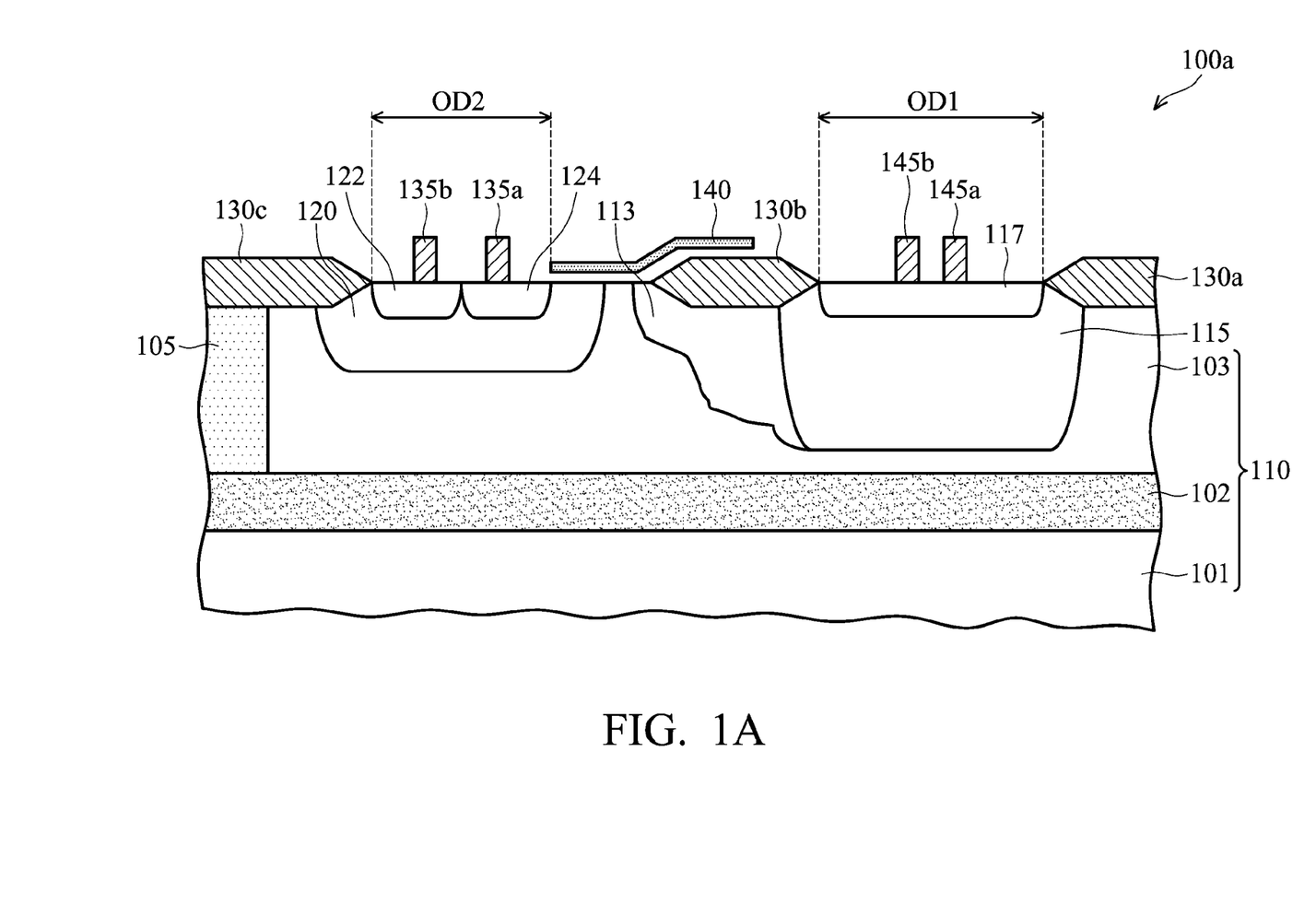
FIG. 1A is a cross section of an embodiment of the insulated gate bipolar transistor electrostatic discharge (IDBT-ESD) protection device of the invention.

FIG. 1A is a cross section of an embodiment of the insulated gate bipolar transistor electrostatic discharge (IDBT-ESD) protection device of the invention. In FIG. 1A, an IDBT-ESD protection device 100a includes a semiconductor substrate 110 and patterned insulation regions 130a, 130b and 130c disposed on the semiconductor substrate 110 defining a first active region OD1 and a second active region OD2. According to an embodiment of the invention, the semiconductor substrate 110 includes a silicon-on-insulator (SOI) substrate, for example, a P-type silicon substrate 101 with an N-type buried layer 102 thereon. A P-type epitaxial layer 103 is formed on the N-type buried layer 102. An isolation region 105 separates the IGBT-ESD protection devices 100a from other devices on the substrate 110.

A high-voltage N-well 115 is formed in the first active region OD1 of the semiconductor substrate 110. A P-body doped region 120 is formed in the second active region OD2 of the semiconductor substrate, wherein the high-voltage N-well 115 and the P-body doped region 120 are separated with a predetermined distance exposing the semiconductor substrate. A diffusion region 113 extends from the high-voltage N-well 115 to the P-body doped region 120. A P+ doped drain region 117 is disposed in the high-voltage N-well 115. Drain electrodes 145a and 145b electrically contact the P+ doped drain region 117. An N+ doped source region 124 and a P+ diffused region 122 are disposed in the P-body doped region 120. Source electrodes 135a and 135b, respectively contact the N+ doped source region 124 and the P+ diffused region 122. A gate structure 140 is disposed on the semiconductor substrate with one end adjacent to the N+ doped source region 124 and with the other end extending over the patterned insulation region 130b.

Figure 1B:
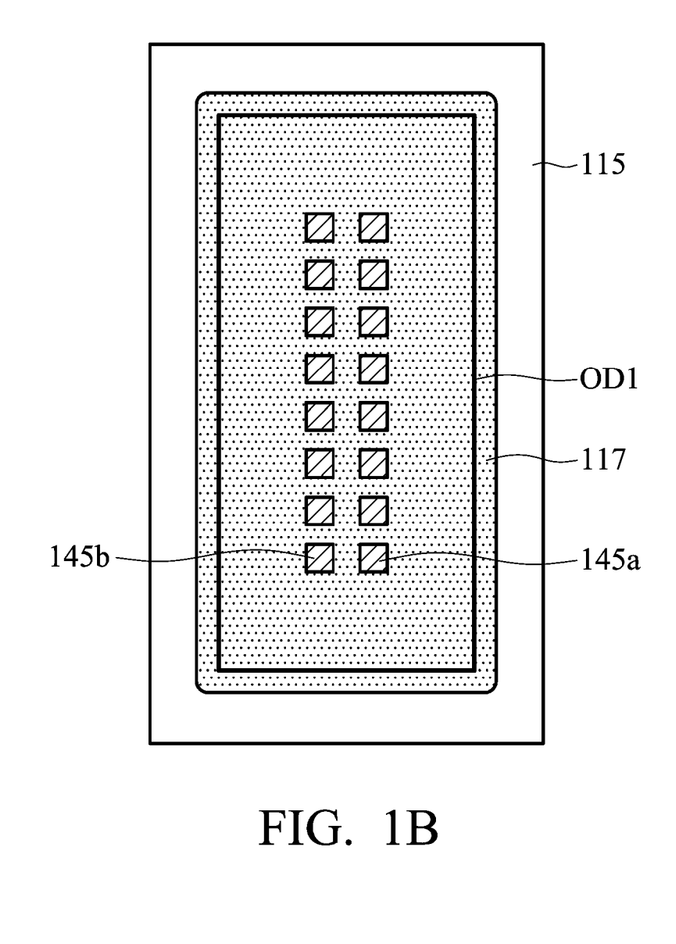
FIG. 1B shows a plan view of the P+ doped drain region, the first active region, and the high-voltage N-well.

According to an embodiment of the invention, the area of the P+ doped drain region 117 can be greater than the first active region OD1, but smaller than the high-voltage N-well 115. The plan view of the P+ doped drain region 117, the first active region OD1, and the high-voltage N-well 115 is shown in FIG. 1B.

Figure 2A:
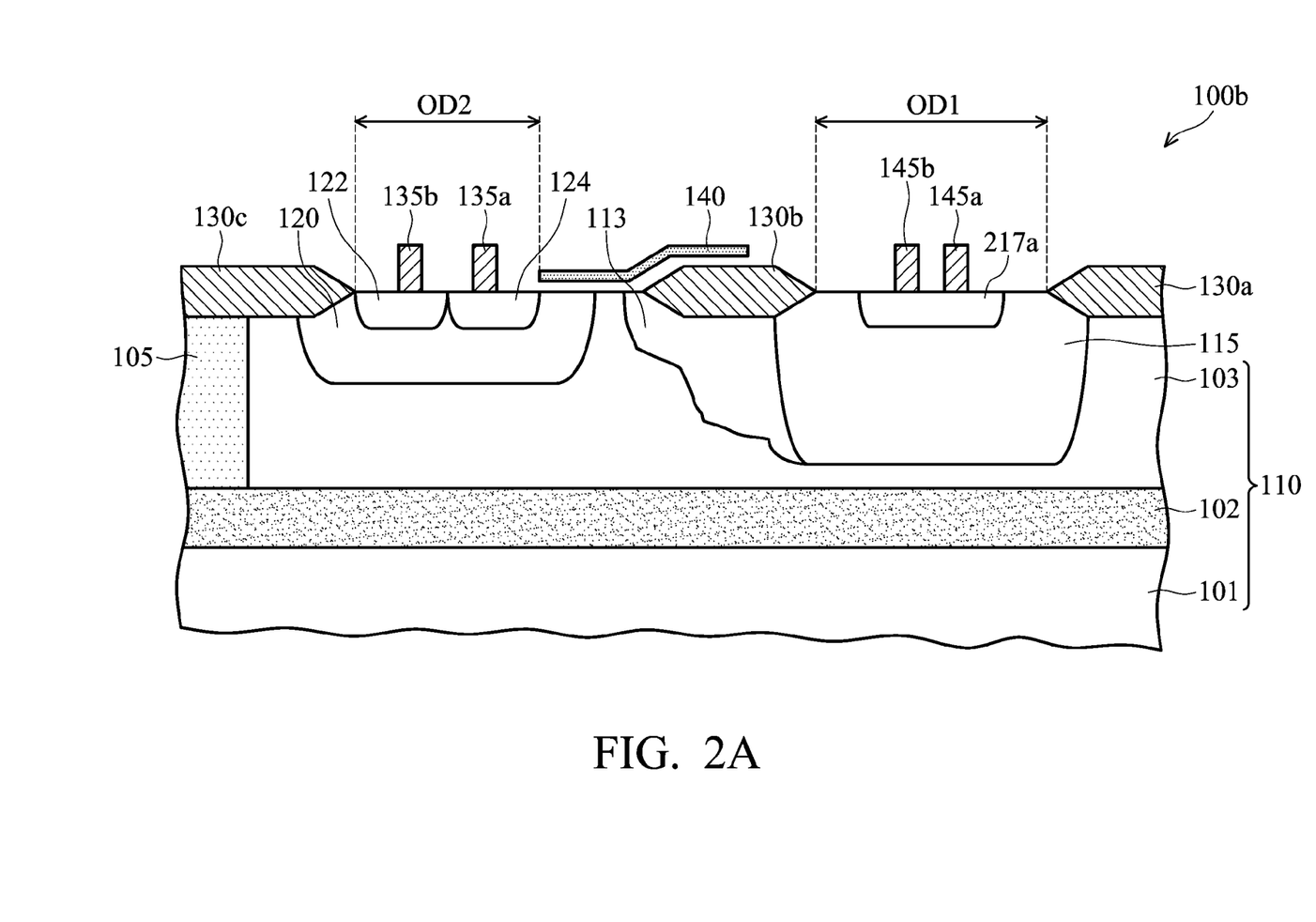
FIG. 2A is a cross section of another embodiment of the insulated gate bipolar transistor electrostatic discharge (IDBT-ESD) protection device of the invention.
Figure 2B:
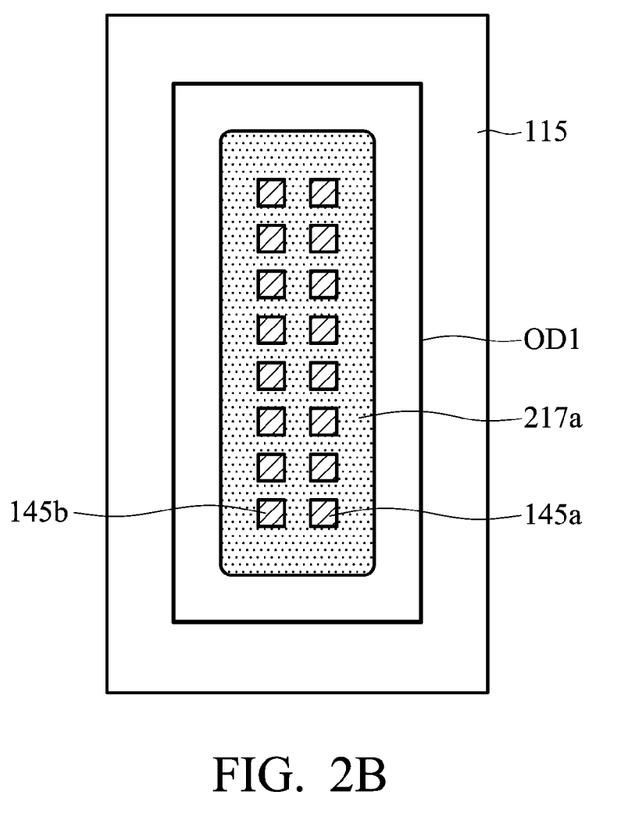
FIG. 2B and FIG. 2C respectively show plan views of the P+ doped drain region, the first active region, and the high-voltage N-well.
Figure 2C:
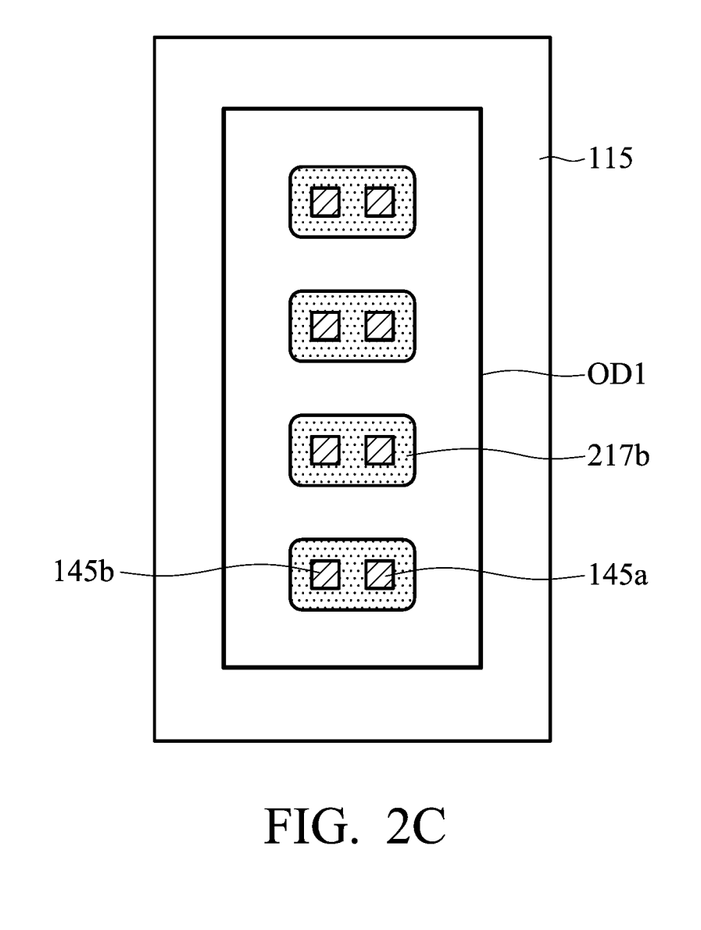

FIG. 2A is a cross section of another embodiment of the insulated gate bipolar transistor electrostatic discharge (IDBT-ESD) protection device of the invention. In FIG. 2A, the IDBT-ESD protection device 100b is nearly identical to the IDBT-ESD protection device 100a of FIG. 1A and for simplicity, like descriptions are omitted. The embodiment of the IDBT-ESD protection device 100b is different from the IDBT-ESD protection device 100a in that the area of the P+ doped drain region 217a is smaller than the area of the high-voltage N-well 115, wherein the layout plan view is shown in FIG. 2B. Within the high-voltage N-well 115, an extrinsic doped interface is interposed between the high-voltage N-well 115 and the P+ doped drain region 217a to disperse and reduce about 0.7V of ESD voltage. According to another embodiment of the invention, the P+ doped drain region 217b comprises a plurality of separated islands, wherein a plan view is shown in FIG. 2C. Since there are extrinsic doped interfaces between the islands 217b and the high-voltage N-well 115, respectively, ESD voltage can be dispersed and reduced and the ESD protection device can be more uniformly turned on.

Figure 3A:
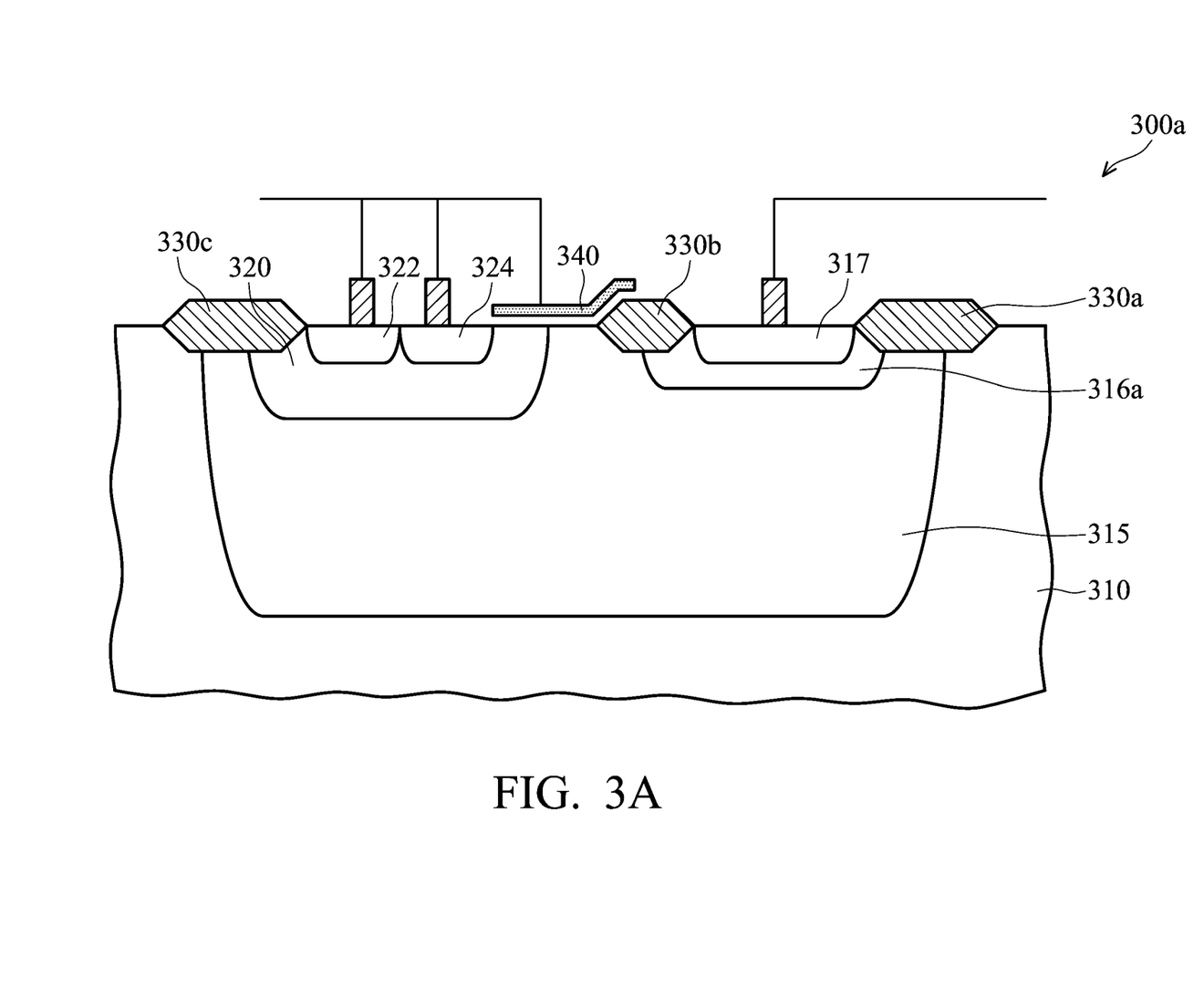
FIG. 3A is a cross section of further another embodiment of the insulated gate bipolar transistor electrostatic discharge (IDBT-ESD) protection device of the invention.

FIG. 3A is a cross section of further another embodiment of the insulated gate bipolar transistor electrostatic discharge (IDBT-ESD) protection device of the invention. In FIG. 3A, an IDBT-ESD protection device 300a includes a semiconductor substrate 310 such as a P-type silicon substrate and a high-voltage N-well 315 is formed in the semiconductor substrate 310. Patterned insulation regions 330a, 330b and 330c are disposed on the high-voltage N-well 315 defining a first active region OD1 and a second active region OD2. An N-type double diffused region 316a is disposed in the first active region of the high-voltage N-well 315. A P+ doped drain region 317 is disposed in the N-type double diffused region 316a. A P-body doped region 320 is formed in the second active region OD2 of the high-voltage N-well 315, wherein the N-type double diffused region 316a and the P-body doped region 320 are separated with a predetermined distance exposing the high-voltage N-well 315. A pair of neighboring N+ doped source region 324 and P+ diffused region 322 is disposed in the P-body doped region 320. A gate structure 340 is disposed on the high-voltage N-well 315 with one end adjacent to the N+ doped source region 324 and with the other end extending over the patterned insulation region 330b.

Figure 3B:
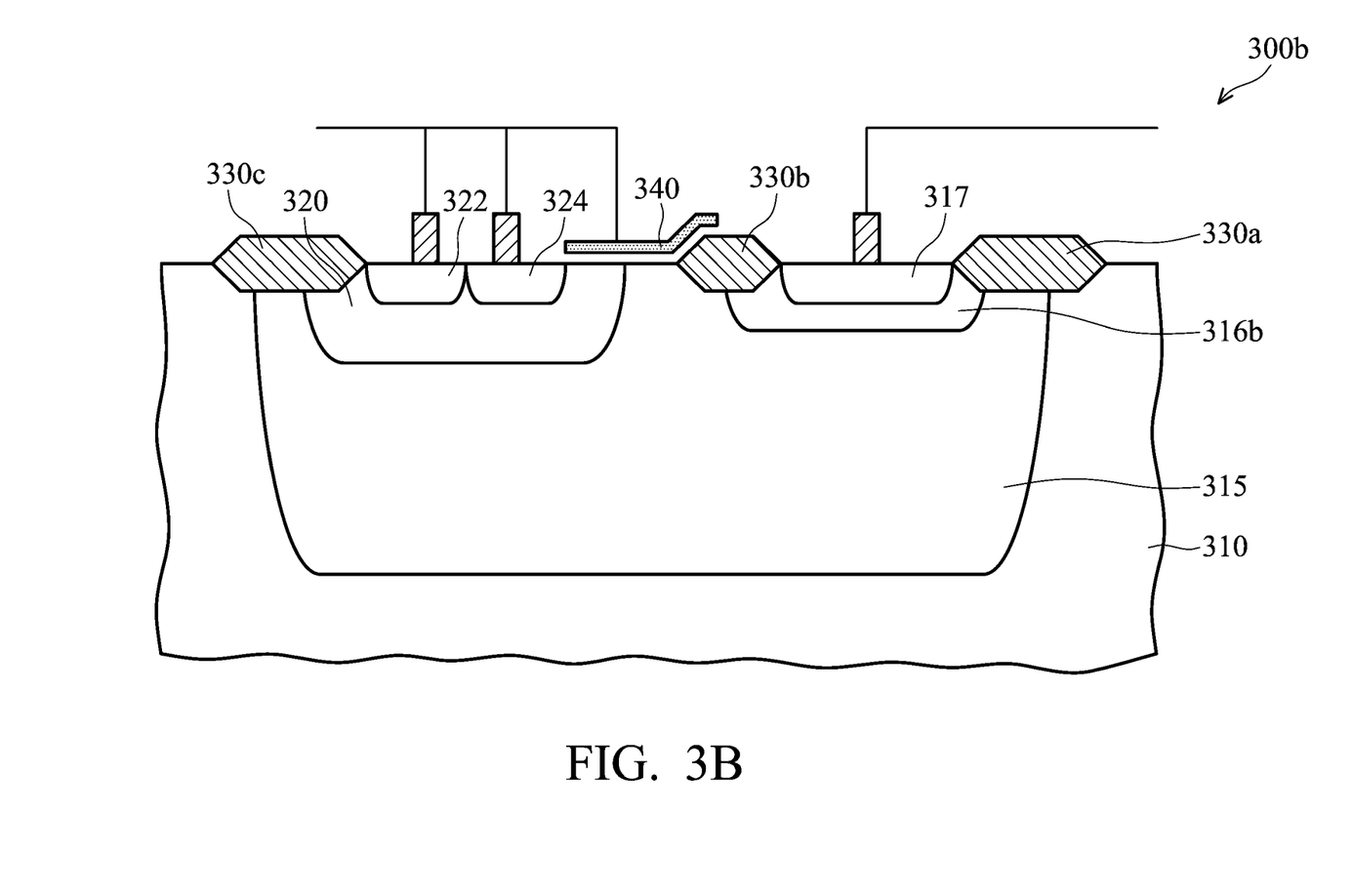
FIG. 3B is a cross section of still another embodiment of the IDBT-ESD protection device of the invention.

FIG. 3B is a cross section of still another embodiment of the IDBT-ESD protection device of the invention. In FIG. 3B, the IDBT-ESD protection device 300b is nearly identical to the IDBT-ESD protection device 300a of FIG. 3A and for simplicity, like descriptions are omitted. The embodiment of the IDBT-ESD protection device 300b is different from the IDBT-ESD protection device 300a in that a P-type double diffused region 316b is disposed in the first active region of the high-voltage N-well 315. A P+ doped drain region 317 is disposed in the P-type double diffused region 316b. Since both the P+ doped drain region 317 and the P-type double diffused region 316b are P-type doped regions, the efficiency and performance of the ESD protection device can be further improved.

Figure 4A:
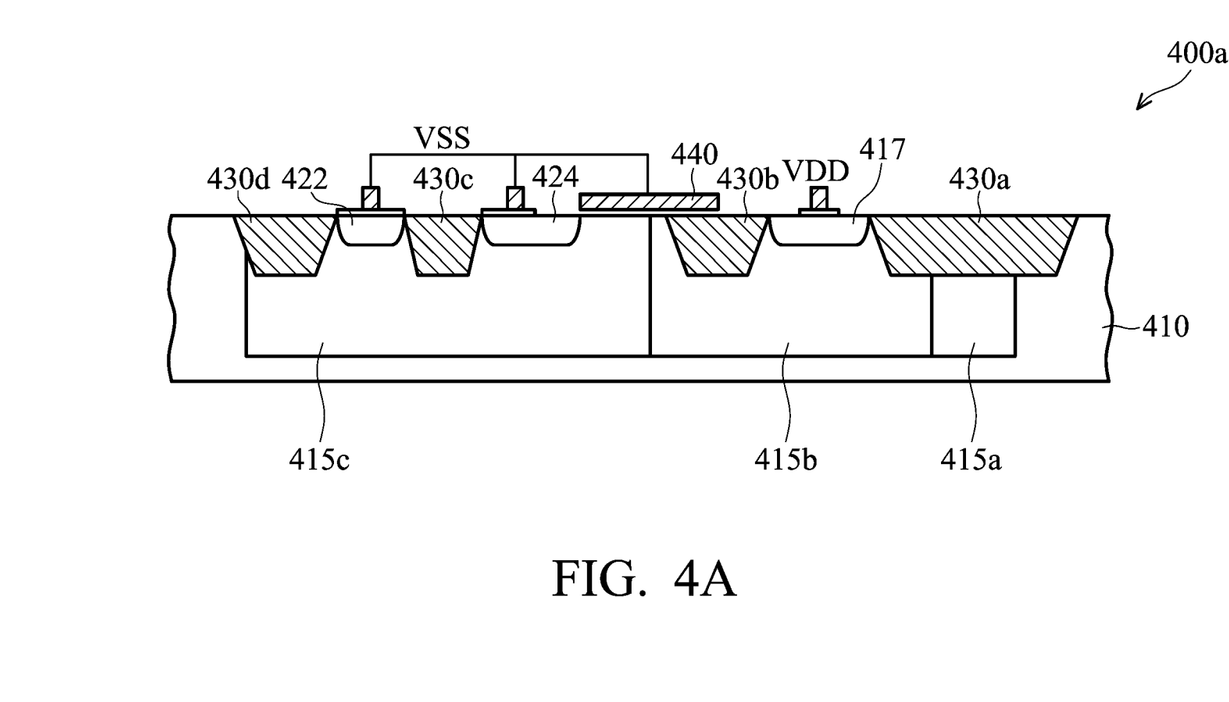
FIG. 4A is a cross section of further another embodiment of the IDBT-ESD protection device of the invention.

FIG. 4A is a cross section of further another embodiment of the IDBT-ESD protection device of the invention. In FIG. 4A, an IDBT-ESD protection device 400a includes a semiconductor substrate 410. A high-voltage N-well 415b is formed in the semiconductor substrate. A high-voltage P-well 415c is formed in the semiconductor substrate. Patterned insulation regions 430a-430d are disposed on the semiconductor substrate defining a first active region in the high-voltage N-well 415b and a second and a third region in the high-voltage P-well 415c. A high voltage P-well 451a is disposed underlying the isolation region 430a. A $P^+$ doped drain region 417 is disposed in the first active region. An $N^+$ doped source region 424 is disposed in the second active region and a P-body doped region 422 is disposed in the third active region. A gate structure 440 is disposed on the high-voltage P-well 415c with one end adjacent to the $N^+$ doped source region 424 and with the other end extending over the patterned insulation region 430b.

Figure 4B:
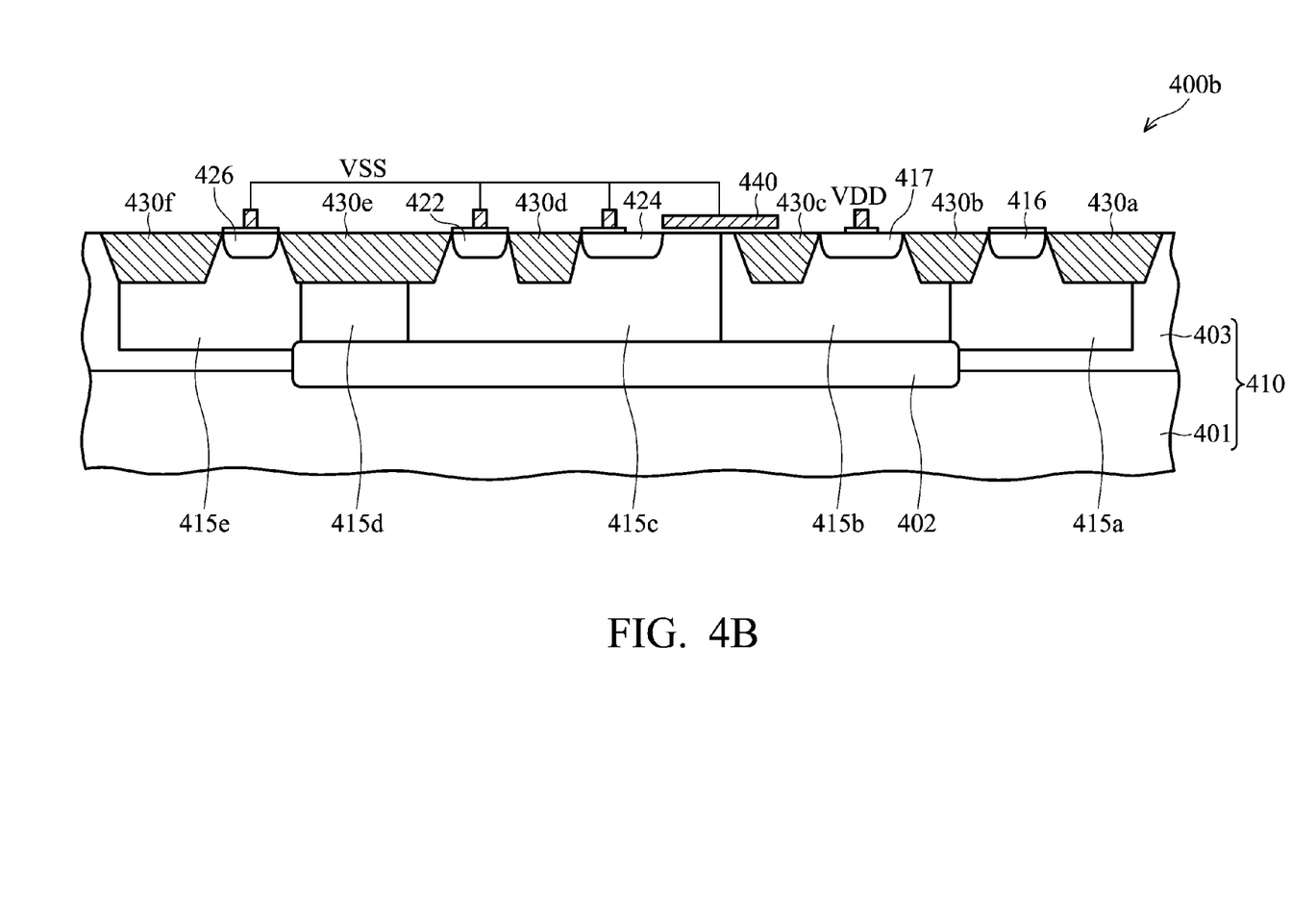
FIG. 4B is a cross section of further another embodiment of the IDBT-ESD protection device of the invention.

FIG. 4B is a cross section of further another embodiment of the IDBT-ESD protection device of the invention. In FIG. 4B, an IDBT-ESD protection device 400b includes a semiconductor substrate 410. For example, the semiconductor substrate comprises a P-type silicon substrate 401 with a P-type epitaxial layer 403 thereon and an N-type buried layer 402 interposed between the P-type silicon substrate 401 and the P-type epitaxial layer 403. A high-voltage N-well 415b is formed in the semiconductor substrate. A high-voltage P-well 415c is formed in the semiconductor substrate. Patterned insulation regions 430a-430f are disposed on the semiconductor substrate defining a first active region in the high-voltage N-well 415b and a second and a third region in the high-voltage P-well 415c. A high voltage N-well 415d is disposed underlying the isolation region 430e. A $P^+$ doped drain region 417 is disposed in the first active region. An $N^+$ doped source region 424 is disposed in the second active region and a P-body doped region 422 is disposed in the third active region. Moreover, an additional $P^+$ doped region 416 is disposed in the high-voltage P-well 415a, and an additional $P^+$ doped region 426 is disposed in the high-voltage P-well 415e. A gate structure 440 is disposed on the high-voltage P-well 415c with one end adjacent to the $N^+$ doped source region 424 and with the other end extending over the patterned insulation region 430c.

Figure 5:
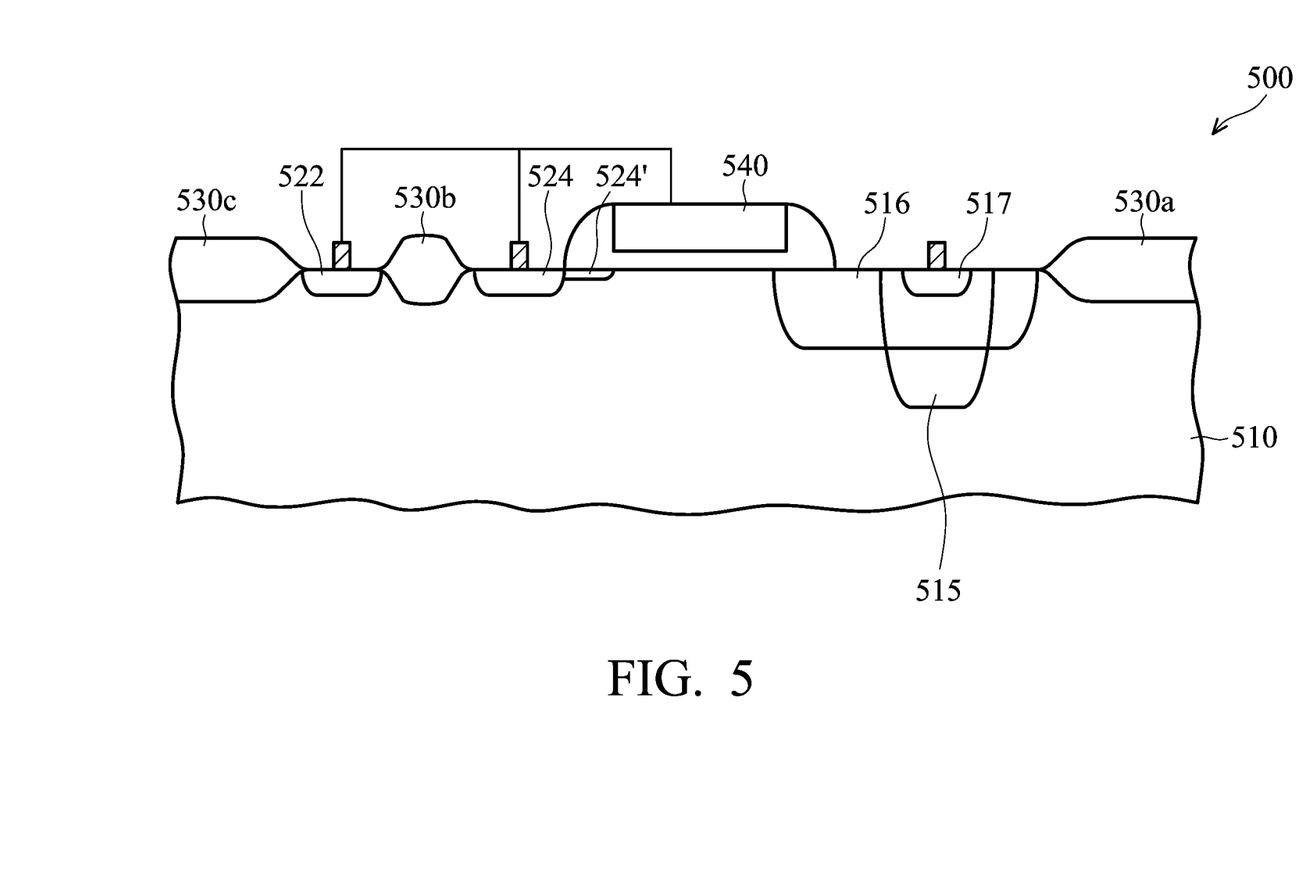
FIG. 5 is a cross section of further another embodiment of the IDBT-ESD protection device of the invention.

FIG. 5 is a cross section of further another embodiment of the IDBT-ESD protection device of the invention. In FIG. 5, an IDBT-ESD protection device 500 includes a semiconductor substrate 510 and patterned insulation regions 530a-530c disposed on the semiconductor substrate 510 defining a first active region and a second active region. A gate structure 540 is disposed on the first active region of the semiconductor substrate. An N-type double diffused region 516 is disposed on one side of the gate structure 540 and formed in the first active region of the semiconductor substrate 510. An N-well 515 is formed in the N-type double diffused region 516 extending towards the semiconductor substrate 510. A $P^+$ doped drain region 517 is disposed in the N-well 515. An $N^+$ doped source region 524 is disposed on the other side of the gate structure 540 in the semiconductor substrate. An N-type light doped drain (NLDD) region 524' extends as underlying spacers of the gate structure 540. A $P^+$ diffused region 522 is disposed in the second active region of the semiconductor substrate.

Note that the IDBT-ESD protection devices of each embodiment of the invention adopt a $P^+$ doped drain region that is smaller than the high-voltage N-well such that an extrinsic doped interface is interposed between the high-voltage N-well and the doped drain region to disperse and reduce about 0.7V ESD voltage. Moreover, the $P^+$ doped drain region can be divided into several separated islands in the high-voltage N-well. Since there are extrinsic doped interfaces between the islands and the high-voltage N-well, respectively, ESD voltage can be dispersed and reduced and the ESD protection device can be more uniformly turned on.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An insulated gate bipolar transistor electrostatic discharge (IGBT-ESD) protection device, comprising:
   a P-type semiconductor substrate;
   a high-voltage N-well formed in the P-type semiconductor substrate;
   a patterned insulation region disposed on the high-voltage N-well defining a first active region and a second active region;
   a P-type double diffused region disposed in the first active region of the high-voltage N-well;
   a single P+ doped drain region disposed in the P-type double diffused region;
   a P-body doped region formed in the second active region of the high-voltage N-well, wherein the P-type double diffused region and the P-body doped region are separated with a predetermined distance exposing the high-voltage N-well;
   a pair of N+ and P+ doped source regions disposed in the P-body doped region; and
   a gate structure disposed on the high-voltage N-well with one end adjacent to the N+ doped source region and with the other end extending over the patterned insulation region, wherein the P-body doped region is separated from the P-type semiconductor substrate only by the high-voltage N-well, and wherein the N+ doped source region is located between the gate structure and the P+ doped source region.

2. The IGBT-ESD protection device as claimed in claim 1, wherein the P-type semiconductor substrate comprises a single crystalline semiconductor substrate, an epitaxial semiconductor substrate, and a silicon-on-insulator (SOI) substrate.

3. The IGBT-ESD protection device as claimed in claim 1, wherein the area of the P+ doped drain region is smaller than the area of the first active region.

4. The IGBT-ESD protection device as claimed in claim 3, wherein the P+ doped drain region comprises a plurality of separated islands.

5. The IGBT-ESD protection device as claimed in claim 1, wherein the P-body doped region is separated from the patterned insulation region.

6. The IGBT-ESD protection device as claimed in claim 1, wherein a depth of the P-body doped region is greater than that of the P-type double diffused region.

7. The IGBT-ESD protection device as claimed in claim 1, wherein the end of the gate structure extends beyond the patterned insulation region without overlapping the N+ doped source region.

8. The IGBT-ESD protection device as claimed in claim 1, further comprising a second patterned insulation region disposed on the high-voltage N-well, wherein the second patterned insulation region is in direct physical contact with the P-body doped region.

9. The IGBT-ESD protection device as claimed in claim 8, wherein the second patterned insulation region is wider than the patterned insulation region.

* * * * *